(12) United States Patent
Watanabe et al.

(10) Patent No.: US 8,227,536 B2
(45) Date of Patent: Jul. 24, 2012

(54) LEAD-FREE SOLDER PASTE AND ITS USE

(75) Inventors: Shizuharu Watanabe, Omi-hachiman (JP); Hidekiyo Takaoka, Omi-hachiman (JP); Kosuke Nakano, Kasatsu (JP); Masafumi Seino, Kanazawa (JP); Ko Inaba, Edogawa-ku (JP)

(73) Assignees: Senju Metal Industry Co., Ltd., Tokyo (JP); Murata Manufacturing Co., Ltd., Kyoto (JP)

( * ) Notice: Subject to any disclaimer, the term of this patent is extended or adjusted under 35 U.S.C. 154(b) by 616 days.

(21) Appl. No.: 11/990,278

(22) PCT Filed: Aug. 11, 2006

(86) PCT No.: PCT/JP2006/315920
§ 371 (c)(1),
(2), (4) Date: Sep. 16, 2009

(87) PCT Pub. No.: WO2007/018288
PCT Pub. Date: Feb. 15, 2007

(65) Prior Publication Data
US 2010/0035072 A1 Feb. 11, 2010

(30) Foreign Application Priority Data
Aug. 11, 2005 (JP) .................................. 2005-232765

(51) Int. Cl.
*C04B 26/12* (2006.01)
(52) U.S. Cl. .......... 524/408; 428/457; 148/24; 228/198; 228/178

(58) Field of Classification Search .................... 524/408
See application file for complete search history.

(56) References Cited

U.S. PATENT DOCUMENTS

| 5,320,272 A | 6/1994 | Melton et al. ............ 228/180.21 |
| 5,429,292 A | 7/1995 | Melton et al. ............ 228/180.22 |
| 2005/0087891 A1* | 4/2005 | Rumer et al. ................. 257/789 |

FOREIGN PATENT DOCUMENTS

| JP | 59085394 | 5/1984 |
| JP | 60180690 | 9/1985 |
| JP | 08174264 | 7/1996 |
| JP | 2001170797 | 6/2001 |
| JP | 2001205477 | 7/2001 |
| JP | 2001219294 | 8/2001 |
| JP | 2002514973 | 5/2002 |
| JP | 2004207494 | 7/2004 |
| JP | 2005072173 | 3/2005 |
| WO | 9637336 | 11/1996 |

OTHER PUBLICATIONS

Takaoka et al., JP2001-205477 machine translation, Jul. 31, 2001.*

* cited by examiner

*Primary Examiner* — Doris Lee
(74) *Attorney, Agent, or Firm* — Michael Tobias

(57) ABSTRACT

A solder paste comprising a solder alloy powder and a flux. The volumetric expansion at the time of melting of the solder alloy is at most 0.5%. The flux contains a bisphenol A epoxy resin and a curing agent selected from a carboxylic anhydride and a dicarboxylic acid. The solder paste can be used in applications suitable for high-temperature solders. The solder alloy has an alloy composition comprising, in mass percent, 70-98% of Bi, a total of 0-0.5% of at least one substance selected from Ag, Cu, Sb, In, Zn, Ni, Cr, Fe, Mo, P, Ge, and Ga, and a remainder of Sn.

11 Claims, No Drawings

LEAD-FREE SOLDER PASTE AND ITS USE

TECHNICAL FIELD

This invention relates to a lead-free solder paste suitable for soldering of electronic parts. Although a solder alloy used in a solder paste according to the present invention itself has a low melting point, the solder paste can be used in applications for which high-temperature solders have conventionally been used. The present invention also relates to electronic parts soldered using this solder paste and a soldering method for electronic parts.

BACKGROUND ART

Soldering of electronic parts has primarily used the alloy Pb-63Sn (in this specification, numbers indicating an alloy composition mean mass percent), which is a eutectic solder. A eutectic solder has a relatively low melting point of 183° C. (since it is a eutectic, the solidus temperature and the liquidus temperature are the same). Since a soldering temperature of 20-50° C. above the liquidus temperature of the solder is generally considered suitable, the soldering temperature of a eutectic solder becomes approximately 200-230° C. If the soldering temperature is in this temperature range, soldering can be carried out without imparting thermal effects to electronic parts or printed circuit boards. A eutectic solder also has excellent solderability, and the eutectic solder has the advantage that the occurrence of unsoldered portions or voids in soldered portions is small.

It is possible to use a high-temperature solder having a high melting point for soldering of electronic parts. For example, a high-temperature solder is ordinarily used in soldering when assembling electronic parts such as power transistors and transformers which generate large amounts of heat when they conduct. If a eutectic solder is used, the solder melts when soldered portions reach a high temperature, or even if the solder does not melt, it increases in temperature close to the melting point of the eutectic solder, its bonding strength markedly decreases, and soldered portions sometimes peel off under small vibrations or impacts.

A high-temperature solder is also used for soldering the first time (referred to below as initial soldering) when soldering is to be again performed in the vicinity of a soldered portion (below, such soldering is referred to as step soldering). For example, step soldering takes place when an electronic part, which was assembled by soldering an electronic element to a substrate, is soldered to a main board in the form of a printed circuit board. If an electronic part is assembled by initial soldering using a eutectic solder and then the same eutectic solder is used for soldering the assembled electronic part to a printed circuit board (this soldering a second time is referred to below as second soldering), at the time of second soldering, the electronic part is exposed to a soldering temperature higher than the melting point of the eutectic solder, the initially soldered portions inside the electronic part melt, and the intended function of the electronic part can no longer be achieved. Therefore, soldering at the time of assembly of an electronic part and more typically initial soldering in step soldering is carried out using a high-temperature solder which does not melt at the second soldering temperature, i.e., at the soldering temperature of a eutectic solder.

Accordingly, it is desired that a high-temperature solder used in step soldering have a solidus temperature higher than 250° C. so as not to melt at the soldering temperature of a eutectic solder. The primary high-temperature solders which have been used up to the present time have been alloys having Pb as a main component such as Pb-5Sn (solidus temperature of 300° C. and liquidus temperature of 314° C.), Pb-10Sn (solidus temperature of 268° C. and liquidus temperature of 301° C.), Pb-5Ag (solidus temperature of 304° C. and liquidus temperature of 365° C.), and the like.

It is difficult to separately recover printed circuit board inside discarded electronic equipment, and they are often disposed of by burial in the ground. In recent years, lead pollution of underground water due to leaching by acidified rain water of Pb from soldered parts such as printed circuit boards disposed of by burial has come to be regarded as a problem. Therefore, the use of solder containing Pb is now restricted, and in its place, lead-free solder which does not contain any Pb has come to be used.

Typical lead-free solders are alloys having Sn as a main component to which one or more elements such as Ag, Cu, Sb, Zn, Bi, In, Ni, Cr, Fe, Mo, P, Ge, and Ga are added. At present, the lead-free solders which are most used are medium-temperature solders such as Sn-3Ag-0.5Cu (solidus temperature of 217° C. and liquidus temperature of 220° C.), Sn-3.5Ag (solidus temperature and liquidus temperature of 220° C.), Sn-0.75Cu (solidus temperature and liquidus temperature of 227° C.), and the like. In order to avoid thermal effects on electronic parts or printed circuit boards, a soldering temperature of 20-40° C. above the liquidus temperature is considered suitable for these medium-temperature lead-free solders, and it is recommended that soldering take place at a temperature of at most 260° C.

In order to carry out lead-free step soldering using a medium-temperature lead-free solder instead of a eutectic solder, it is necessary to carry out initial soldering using a high-temperature lead-free solder having a solidus temperature higher than 260° C. which will not melt at the temperature of second soldering using a medium-temperature solder. However, with a lead-free solder having Sn as a main component, even if it contains a large amount of high melting point metals such as Ag, Cu, Sb, Ni, Cr, Fe, and Mo, only the liquidus temperature of the solder increases, and the solidus temperature cannot be increased to at least 260° C. Thus, there are no high-temperature solders suitable for use in step soldering among lead-free solders having Sn as the main component.

Therefore, in Europe, RoHS Regulations provide the exception that solders having Pb as a main component can be used only for high-temperature solders. In Japan, although it is not a legal restriction, there is a policy that users should regulate themselves and refrain from using solder containing any Pb. Since a high-temperature lead-free solder does not exist, when step soldering is carried using a lead-free solder, the solder used in initially soldered portions remelts at the time of second soldering, and it is difficult to avoid the occurrence of cracks in soldered portions or positional deviation of electronic parts.

Soldering for the purpose of mounting electronic elements on a substrate to form electronic parts is often carried out by the reflow method using solder paste. A solder paste is formed by mixing solder powder and a flux to form a paste. A solder paste can easily be applied to prescribed locations by screen printing or the like. In the reflow soldering method, even when there are positional deviations of electronic elements disposed on a substrate, due to the surface tension of molten solder at the time of solder reflow, a self-alignment effect is achieved in which the elements are aligned on suitable locations.

In JP 2001-219294 A1 (Patent Document 1), one of the present applicants proposed a solder paste comprising a flux containing a thermosetting resin and a solder powder. After soldering is performed with this solder paste, a flux residue containing a resin remains and covers soldered portions. The bonding strength of the solder is reinforced by the adhesive strength of the thermosetting resin, so an extremely strong bonding strength can be obtained. As a result, it becomes unnecessary to carry out filling of the areas surrounding a soldered portion with resin (referred to as underfilling) in order to strengthen the bonds of soldered portions. Examples which are given of a solder powder for the solder paste are 63Sn—Pb (melting point of 183° C.), Sn-3.5Ag-0.75Cu (solidus temperature of 217° C. and liquidus temperature of 220° C.), and Sn-2.5Ag-1Bi (solidus temperature of 214° C. and liquidus temperature of 220° C.).

In JP 2005-72173 A1 (Patent Document 2), the present applicants proposed an electronic part in which at least a portion of the components thereof are soldered using a high-temperature solder comprising Bi or an alloy having Bi as a main component and having a solidus temperature of at least 260° C. and a liquidus temperature of at most 360° C., and in which the soldered portions are reinforced by flux residue containing a thermosetting adhesive.

JP 2001-170797 A1 (Patent Document 3) discloses a soldering flux containing an adhesive resin and a curing agent and a solder paste containing this flux.

In JP 2004-207494 A1 (Patent Document 4), in an electronic apparatus which is manufactured by initial soldering of an electronic element to a substrate and filling the periphery of the soldered portion with a resin (underfill) and then by second soldering to mount the electronic part which is formed on a mounting substrate (a printed wiring board), at the time of initial soldering, a solder alloy is used having a different of at most 5% between its volume as a solid and its volume as a liquid. Examples which are given of such a solder alloy are (15-80)Bi—Sn alloys and (15-80)Bi-(0.5-3)Ag—Sn alloys, but the alloys shown in the examples are only Sn-30Bi, Sn-40Bi, Sn-57Bi, and Sn-57Bi-(0.5-2.5)Ag alloys, and high Bi—Sn alloys having a Bi content of greater than 57% were not tested. A Sn-57Bi alloy, which has a composition close to the eutectic composition of a Bi—Sn based alloy, has a solidus temperature of 138° C. and a liquidus temperature of 139° C. There is no description concerning using a thermosetting resin as an underfill.

The object of Patent Document 4 is to make it possible to carry out step soldering using a lead-free solder. By using a solder alloy for which the difference between its volume as a solid and its volume as a liquid is at most 5% at the time of initial soldering and surrounding a soldered portion after initial soldering with an underfill, even if the initially soldered portion melts due to the heat at the time of second soldering, there are almost no gaps or cracks in the initially soldered portion, and the occurrence of short circuits between electrodes due to inflow of molten solder can be prevented.

However, the technology disclosed in Patent Document 4 has problems like the following.

First, in a separate step, it is necessary to completely fill the space in the periphery of the initially soldered portion with the underfill resin and cure the resin. Curing of a resin is normally carried out by heating for around 30 minutes at 130-160° C., and since this takes time, it markedly worsens productivity.

In addition, a solder alloy having a composition of Sn-(30-57)Bi which is used in the examples of Patent Document 4 has a solidus temperature and a liquidus temperature which are close to each other. Thus, when the alloy is remelted during second soldering, if a force is applied, the initially soldered portion easily breaks, and there are cases in which the initially soldered portion completely melts due to heating during operation of electronic equipment. Furthermore, Ag plating or Ag—Pd plating covering Cu electrodes of electronic parts more easily melts in this alloy than in a 63Sn—Pb eutectic alloy, and if such melting occurs, electrocorrosion of Cu electrodes sometimes occurs during conduction of electricity.

The solder alloys with a composition in the range of Sn-(30-57)Bi which are specifically disclosed in Patent Document 4 have an increase in volume at the time of melting of at least 1.0% even if they contain a fairly large amount of Ag, which has the effect of suppressing changes in volume.

DISCLOSURE OF INVENTION

A general object of the present invention is to provide a solder paste which makes it possible to perform step soldering using a lead-free solder and which does not have the above-described problems of Patent Document 4.

As described in Patent Documents 1-3, if soldering is carried out using a solder paste which is a mixture of a flux containing a sufficient amount of a thermosetting resin and a curing agent with a solder powder, thermoset flux residue covers soldered portions, and the bonding strength of soldered portions is increased, making an underfill unnecessary.

However, if this solder paste is applied to initial soldering in step soldering, at the time of heating in subsequent second soldering, cracks develop in the thermoset resin in the periphery of the initially soldered portion, molten solder leaks out from the locations where cracks occur, and short circuits sometimes occur due to electrical conduction between electrodes.

The present inventors investigated whether this problem could be solved in the step soldering techniques disclosed in Patent Document 4.

Thermosetting resins used in underfills are primarily epoxy resins. Epoxy resins are also used as thermosetting resins or adhesives in Patent Documents 1-3. There are various types of epoxy resins, but the types which have excellent bonding strength to metal and are effective at reinforcing bonds of soldered portions are bisphenol A epoxy resins, which are bifunctional straight chain epoxy resins.

Bisphenol A epoxy resins have adequate heat resistance, but when they are thermally set, they have poor flexibility, so they cannot absorb the expansion of molten solder during heating at the time of second soldering and become easy to break. If an underfill breaks, molten solder leaks out from the underfill, causing defects such as short circuits between electrodes.

If a Bi—Sn alloy having a composition of Sn-57Bi which is close to a eutectic is used as in Patent Document 4, the reflow temperature can be decreased to lower than 200° C., and it becomes possible to use a thermosetting resin which has a lower heat resistance than a bisphenol A epoxy resin but which is more flexible and can withstand expansion. However, in this case, the solidus temperature and the liquidus temperature of the solder alloy both become low values of less than 140° C., and the problems that initially soldered portions easily break when a force is applied at the time of second soldering, that the heat resistance of initially soldered portions is poor, and that electrocorrosion of Cu electrodes easily occurs during electrical conduction cannot be avoided. Furthermore, if a bisphenol A epoxy resin, which is most commonly used as an underfill, cannot be employed, a strong bonding strength is not obtained.

A specific object of the present invention is to provide a lead-free solder paste useful for initial soldering in step soldering which does not experience breakage of underfill due to heating at the time of second soldering and which does not cause short circuits between electrodes caused by leakage of molten solder from broken underfill even when a thermosetting resin contained in the flux as an underfill material is a bisphenol A epoxy resin.

The present inventors noticed that the volumetric expansion at the time of melting of a Bi—Sn based solder alloy having a Bi content of 70-98 mass percent is an extremely small value of at most 0.5%. If a solder paste manufactured from this solder alloy and a flux containing a thermosetting resin is used for initial soldering in step soldering, the change in volume of initially soldered portions due to the heat of second soldering is extremely small. As a result, it was found that even if the thermosetting resin contained in the flux as an underfill material is a bisphenol A epoxy resin, breakage of the underfill during second soldering does not occur.

The composition of this alloy is very different from a eutectic composition, which is in the vicinity of Sn-57Bi, and the solidus temperature is a low value of 138-139° C. Even so, its liquidus temperature is at least 180° C., preferably at least 200° C., and still more preferably at least 210° C. This alloy does not readily cause leaching or electrolytic corrosion of Cu electrodes.

The present invention is a lead-free solder paste comprising a solder alloy powder and a flux, characterized in that the solder alloy powder contains 70-98 mass % of Bi, 2-30 mass % of Sn, optionally at least one of Ag, Cu, Sb, In, Zn, Ni, Cr, Fe, Mo, P, Ge, and Ga in a total amount of at most 0.5 mass %, and in that the flux contains a bisphenol A epoxy resin and a curing agent selected from a dicarboxylic acid and a carboxylic anhydride.

The present invention also relates to a soldering method in which the epoxy resin reacts with the curing agent and is cured during soldering using the above solder paste and a soldered portion covered with a thermoset epoxy resin is formed, and an electronic part having a soldered joint formed in this manner, and particularly an electronic part having an electronic element soldered to a substrate.

A solder paste according to the present invention can be used instead of high-temperature solder in initial soldering of step soldering (soldering for the first time). If second soldering is carried out, it is possible to carry out completely lead-free step soldering by performing second soldering using, for example, the above-described medium-temperature lead-free solder having Sn as a main component. However, a solder paste according to the present invention is not limited to this application, and it can also be applied to all types of soldering which have conventionally employed high-temperature solder.

Step soldering using a solder paste according to the present invention is a step soldering method in which a soldered part is manufactured by first soldering and the soldered part is soldered to another material by second soldering, characterized by carrying out the first soldering using the above-described solder paste. In this method, the second soldering is preferably carried out using a lead-free solder having Sn as a main component.

The present invention also relates to an electronic part having an electronic element bonded to a substrate by a soldered joint, wherein a solder alloy constituting the soldered joint has volumetric expansion at the time of melting of at most 0.5%, and the soldered joint is covered by a material primarily comprising a thermally set bisphenol A epoxy resin.

A solder paste according to the present invention contains a bisphenol A epoxy resin, which is easily broken by expansion, as a thermosetting resin which functions as an underfill. However, volumetric expansion of soldered portions at the time of melting is extremely small. Therefore, this solder paste can be used for initial soldering in step soldering without breakage of the underfill occurring, even if an initially soldered portion is heated to a temperature of 260° C. which is the upper limit on the reflow temperature of a medium-temperature solder at the time of second soldering. Accordingly, the occurrence of short circuits between electrodes caused by leakage of molten solder is prevented.

Since the Bi content of the Bi—Sn based solder alloy is much higher than that in a eutectic composition, and its liquidus temperature is considerably higher than its solidus temperature, breakage does not occur even when a force is applied at the time of remelting due to the heat of second soldering. Moreover, since the Sn content of the solder alloy is small, Ag plating or Ag—Pd plating on Cu electrodes of electronic parts does not dissolve in molten solder, and electrolytic corrosion of Cu electrodes during long periods of use does not occur.

In addition, as a result of using a bisphenol A epoxy resin as a thermosetting resin, the underfill is strong and has a high bonding strength. Thus, the underfill is durable, and the reliability of soldered connections is high. As a result of using a dicarboxylic acid or carboxylic anhydride as a curing agent, good wettability by solder can be obtained, the occurrence of solder balls is low, and the occurrence of short circuits by solder balls is prevented.

BEST MODE FOR CARRYING OUT THE INVENTION

A solder paste according to the present invention is obtained by mixing a Bi—Sn based lead-free solder powder containing a large amount of Bi and having extremely low volumetric expansion at the time of melting of at most 0.5% with a flux containing a bisphenol A epoxy resin and a specific curing agent.

When an electronic element is soldered to a circuit board using the solder paste of the present invention, the flux spreads over the portion being soldered and its periphery and performs the function of cleaning the surfaces being soldered. After soldering, the spread flux residue adheres to the soldered portion and covers the soldered portion and spreads over the surface of the circuit board. The flux residue contains a bisphenol A epoxy resin which reacted with the curing agent and thermally set as well as residue of other flux components. A coating of this flux residue functions as underfill which reinforces the bonding strength of the soldered portions. Therefore, even when the solder is a lead-free solder with a large Bi content which has a relatively low bonding strength and is brittle, a sufficient bonding strength can be imparted to soldered portions. After thermally setting, the epoxy resin which spread over the surface of the circuit board functions as an insulator and prevents short circuits between electrodes.

A Bi—Sn based solder alloy having a Bi content of 70-98 mass % which is used in the present invention has volumetric expansion at the time of melting of at most 0.5%. Therefore, when it is used for initial soldering in step soldering of an electronic part (such as for soldering an electronic element to a substrate), even if it is subjected to the heat of second soldering (such as during soldering when mounting an electronic part on a printed wiring board) and melts, the volumetric expansion of the initially soldered portion is extremely small.

If the volumetric expansion at this time is large, the increase in the volume of molten solder due to expansion cannot be absorbed by elongation of the thermally set resin coating, and the molten solder breaks the resin and flows outward. The molten solder which flows outwards peels off portions which are adhered by the resin and penetrates between the resin and the substrate to cause short circuits between the electrodes of the substrate.

In the present invention, a bisphenol A epoxy resin which has excellent heat resistance after curing is used as a thermosetting resin. However, since a bisphenol A epoxy resin has low flexibility, the resin easily breaks if the thermal expansion of the molten solder is large. By using a solder alloy having extremely low volumetric expansion at the time of melting, breakage and penetration of the resin and the occurrence of short circuits caused thereby are prevented.

As described in Patent Document 4, when an underfill is formed after soldering, a thermosetting resin fills a space, and the resin is crosslinked and cured by heat, light, or radiation. A typical example of heating for usual thermal crosslinking is 130-160° C. for 30 minutes. However, with a solder paste according to the present invention, crosslinking and curing of the underfill is carried out at the same time as soldering. Namely, the underfill is cured by heating for a short length of time, such as heating at 230° C. or above for 20 seconds, which are usual reflow conditions for a lead-free solder.

The volumetric expansion at the time of melting of a Bi—Sn based solder alloy used in the present invention may be negative (namely, the volume may contract due to melting). When the volume of the initially soldered portion contracts due to heating at the time of second soldering, stress is not imparted to the surrounding thermally set resin. Therefore, if the heat resistance of the resin is sufficient, there is no concern of molten solder flowing outwards from the resin to the periphery. A bisphenol A epoxy resin used in the present invention has good heat resistance. Accordingly, when the volumetric expansion is negative, there is no particular limit on the absolute value of the expansion (percent contraction), and it may be larger than 0.5%. However, it is undesirable for large gaps to be formed inside the resin coating due to melting of the solder, and the amount of contraction is preferably at most 2%.

The solder alloy used in the present invention is a Bi—Sn based alloy (a binary alloy or higher order alloy) comprising, in mass percent, 70-98% of Bi and a remainder of Sn. Bi is one of the few elements which contract at the time of solidification. When the content of Bi is at least 70%, the solder alloy has volumetric expansion at the time of melting of at most 0.5%. The Bi content is preferably 75-98%, more preferably, 80-98%, and most preferably greater than 80% and less than 85%.

When the Bi content is less than 70%, the volumetric expansion at the time of melting exceeds 0.5%, resulting in an increased possibility of the occurrence of short circuits between electrodes at the time of step soldering. In addition, with a Bi—Sn alloy having a Bi content of less than 70%, the solidus temperature and liquidus temperature come too close to each other and it becomes easy for breakage to occur when force is applied when remelting takes place due to heating at the time of second soldering. Furthermore, a lower Bi content increases the Sn content, which makes it easier for Ag plating or Ag—Pd plating on electrodes of electronic parts to melt in the solder, and electrolytic corrosion of Cu electrodes at the time of operation increases. On the other hand, when the Bi content exceeds 98%, the solidus temperature of the solder alloy becomes higher than 139° C., and the self-alignment effect of the solder decreases.

One or more additional elements can be added to a Bi—Sn based solder alloy used in the present invention as long as the characteristic that the volumetric expansion at the time of melting is at most 0.5% is maintained. For example, Ag, Sb, Zn, Cu, Ni, Cr, Fe, Mo, and the like increase the bonding strength of the solder alloy itself. In and P increase wettability, while P, Ge, Ga, and the like prevent oxidation at the time of soldering, both of which lead to an increase in bonding strength. The total added amount of these additional elements is at most 0.5 (mass) %. If a larger amount is added, the volumetric expansion at the time of melting will exceed 0.5%.

The solder alloy is used in the form of a powder. The powder is preferably a spherical or roughly spherical powder. There is no particular limit on the particle diameter of the solder alloy powder used in the solder paste, but generally it is in the range of 10-50 μm.

A solder paste is formed by mixing a solder alloy powder and a flux to form a paste. A flux used in the present invention contains a bisphenol A epoxy resin and a specific curing agent.

A bisphenol A epoxy resin, which is a bifunctional straight chain compound having an epoxy group at its end, is manufactured by a condensation reaction between bisphenol A (2,2-bis(p-hydroxyphenyl)propane) and epichlorohydrin. Bisphenol A may have a substituent group (such as bromine). As is well known, in order to thermally set an epoxy resin and form it into a solid, it is necessary to react it with a curing agent.

A cured bisphenol A epoxy resin has a high bonding strength and excellent heat resistance, but it has the drawback that it is hard and lacking in flexibility. Therefore, if the volumetric expansion at the time of melting of a solder alloy used in a solder paste is large, when soldered portions melt at the time of second soldering, the resin cannot withstand the stress applied by expansion of the solder, the resin surrounding the solder is broken, and molten solder leaks out and causes short circuits between electrodes. In the present invention, since the volumetric expansion at the time of melting of the solder alloy is at most 0.5%, even if a bisphenol A epoxy resin is used as a thermosetting resin, the resin does not break.

A bisphenol A epoxy resin is in the form of a liquid when it has a low degree of polymerization, and it becomes a solid as the degree of polymerization increases. Liquid resins vary from low viscosity to high viscosity, and liquid resins having the lowest viscosity are essentially monomers (bisphenol A diglycidyl ether). A bisphenol A epoxy resin used in the present invention can be one or more types which are selected taking into consideration the viscosity of the solder paste when the resin is contained in the paste. When a solder paste contains a solid resin, the viscosity of the solder paste becomes too high. Thus, usually it is preferable to use a liquid bisphenol A epoxy resin, namely, a monomer or an oligomer.

Representative curing agents for curing an epoxy resin are amines including monoamines and polyamines, isocyanurates, carboxylic acids including carboxylic acids and its anhydrides, and crosslinked resins such as phenolic resins and urea resins. Among these substances, amines are the most widely used.

In the present invention, for reasons to be described below, a carboxylic acid selected from dicarboxylic acids and carboxylic anhydrides is used as a curing agent. Examples of carboxylic acid curing agents which can be used in the present invention are phthalic anhydride, tetrahydrophthalic anhydride, hexahydrophthalic anhydride, methyltetrahydrophthalic anhydride, methylhexahydrophthalic anhydride, adipic acid, glutaric acid, and malonic acid.

A carboxylic anhydride is ordinarily used as a curing agent for an epoxy resin. A free dicarboxylic acid such as adipic acid has a slow curing rate, so it is not ordinarily used as a curing agent for an epoxy resin. However, in the present invention, curing of an epoxy resin takes place at an extremely high temperature at the time of soldering, and even a free dicarboxylic acid can adequately function as a curing agent.

In general, a flux for a solder paste is formed by dissolving solids such as a rosinous resin including rosin and derivatives thereof, a thixotropic agent, an activator, and the like in a liquid solvent to form a paste. Rosinous resins include rosin, polymerized rosin, WW (water white) rosin, hydrogenated rosin, and the like. Abietic acid, which is the main component of rosin, is a monocarboxylic acid, so it is not a curing agent for an epoxy resin in the present invention. However, it can react with an epoxy resin. Hardened castor oil, aliphatic amides, and the like can be used as a thixotropic agent. Organic acids, hydrohalide amines, and the like can be used as an activator. When a dicarboxylic acid or a carboxylic anhydride is used as an organic acid activator, it also functions as a curing agent for an epoxy resin in the present invention. A substance which readily dissolves the above-described solid components and is of low toxicity such as ethylene glycol monobutyl ether, diethylene glycol monoethyl ether, diethylene glycol monobutyl ether, and the like can be used as a solvent.

A flux used in a solder paste according to the present invention may be a flux used in a conventional solder paste further containing the above-described thermosetting resin and curing agent.

The basic object of a flux is to clean the solder surface and the surface to be soldered at the time of soldering and to make the surface to be soldered easily wet by molten solder. A thermosetting resin is not wet by solder, so the addition of a thermosetting resin can possibly impair wettability. In a solder paste according to the present invention, by using a dicarboxylic acid and/or a carboxylic anhydride as a curing agent for a thermosetting resin, even if a thermosetting resin is added to flux, the same wettability can be guaranteed as when a thermosetting resin is not added. As for other curing agents, solder loses all wettability when a crosslinked resin is used, and wettability becomes poor when amines or isocyanurates are used as a curing agent. In either case, a large amount of solder balls form.

A carboxylic acid has better wettability as a curing agent than a commonly used amine. The reasons why it is suitable for a solder paste according to the present invention are conjectured to be as follows.

A flux for soldering performs the function of reducing oxides present on the surface of a printed substrate or electronic parts and cleaning the surface. The effect of reducing oxides is greater in an acidic environment than in a basic one. In addition, because an amine curing agent directly acts in a ring-opening addition polymerization of epoxy groups to form an epoxy resin, its curing speed is high. On the other hand, with a carboxylic acid curing agent, because curing takes place in two stages of reaction through ester formation, the speed of polymerization becomes somewhat slightly slower.

When using a solder paste, it is necessary to wet a surface being soldered with molten solder by the action of flux. If a thermosetting resin sets prior to complete wetting by solder, the solder which could not perform wetting forms balls. Therefore, a carboxylic acid curing agent which has a slow curing speed is advantageous. As stated above, a dicarboxylic acid has a slower curing speed than a carboxylic anhydride. Accordingly, when the soldering temperature is high, it is preferable to use a dicarboxylic acid as all or a portion of a curing agent so that curing of the epoxy resin will not take place prior to wetting by solder.

The contents of a bisphenol A epoxy resin and a carboxylic acid curing agent in the flux, in mass percent, are preferably 10-50%, more preferably 20-40%, and still more preferably 25-35% for the epoxy resin, and preferably 5-50%, more preferably 10-40%, and still more preferably 15-30% for the carboxylic acid curing agent (including the amount used as an activator). If the contents of these materials are too small, the thermosetting resin coating which functions as an underfill does not completely cover solder, and leakage of molten solder at the time of second soldering sometimes cannot be prevented. On the other hand, if the contents are too large, the basic objective of flux can no longer be achieved, and wettability may decrease.

The contents of a rosinous resin, a thixotropic agent, an activator, and a solvent may be the same as for a conventional flux. However, a flux according to the present invention contains a fairly large amount of an epoxy resin and a curing agent, so the amounts of these other materials are comparatively small. When the amount of a carboxylic acid which is contained in the flux as a curing agent for an epoxy agent is large, the flux need not contain any rosinous resin at all. A preferred content of a rosinous resin in the flux is 0-40 mass %.

The ratio of solder powder to flux in a solder paste according to the present invention is preferably in the range of 1:1 to 1:1.5 as a volume ratio.

Soldering using a solder paste according to the present invention can be carried out in the same manner as with a conventional solder paste. The soldering temperature (the heating temperature in a reflow furnace) is preferably in the range of 20-50° C. above the liquidus temperature of the solder alloy being used. The liquidus temperature of a solder alloy having a Bi content of at least 90 mass % exceeds 220° C., but even with such an alloy, the soldering temperature is preferably at most 260° C. During soldering, the flux first cleans the surface to be soldered and renders the surface easily wet by molten solder. The epoxy resin in the flux then reacts with the curing agent and is cured, and the cured epoxy resin becomes flux residue. As a result, the periphery of the resulting soldered portion comprising a Bi—Sn based alloy is covered by the cured bisphenol A epoxy type resin. When the flux contains a rosinous resin, since the rosinous resin is also a carboxylic acid, it reacts with the epoxy resin and is incorporated into the cured epoxy resin.

Soldering employing a solder paste according to the present invention can be utilized, for example, to manufacture electronic parts by mounting electronic elements on a circuit board. A solder paste according to the present invention may be used for all the soldered portions of an electronic part, or it may be used for only a portion of the soldered portions of an electronic part.

An electronic part which is manufactured in this manner is again heated at the time of second soldering when being mounted on a printed wiring board. Due to the heat at this time, the soldered portions of the electronic part are at least locally melted, but as stated above, even if the soldered portions melt, they are covered by the epoxy resin, and even if molten solder expands, its expansion is extremely small, so breakage of the epoxy resin does not occur, and molten solder does not leak out to the exterior of the resin. Second soldering can generally be carried out using a lead-free solder having Sn as a main component.

EXAMPLES

Example A

The melting points (solidus temperature and liquidus temperature) and volumetric expansion at the time of melting (the ratio of the volume at the liquidus temperature to the volume at the solidus temperature) of the alloys shown in Table 1 were measured.

Solder powder of these solder alloys (average particle diameter of 25-35 μm) was mixed in the following proportions with flux A having the composition shown below (% indicates mass %) to prepare a solder paste, and self-alignment properties were tested. The results are also shown in Table 1. The bisphenol A epoxy resins used in the examples were all liquid monomers (bisphenol A diglycidyl ether).

charged into a specific gravity bottle and heated to a prescribed temperature in an oven. The heating temperature was made 30° C. above the liquidus temperature of the solder. The solder was then gradually cooled, and the volume was read when the liquidus temperature of the solder was reached.

The volume at the solidus temperature was calculated from the following formula:

Volume at solidus temperature=volume at room temperature×(solidus temperature of each solder−20)×coefficient of linear expansion

TABLE 1

| | | | Composition | | | | | | | | | Melting point (° C.) | | Expansion | Self-alignment: Number of |
|---|---|---|---|---|---|---|---|---|---|---|---|---|---|---|---|
| | No. | Bi | Sn | Ag | Cu | Sb | In | Zn | Ni | Ge | P | other | solidus | liquidus | (%) | NG (out of 20) |
| Examples | 1 | 70 | rem | | | | | | | | | | 139 | 180 | 0.5 | 0 |
| | 2 | 80 | rem | | | | | | | | | | 139 | 210 | −0.4 | 2 |
| | 3 | 85 | rem | | | | | | | | | | 139 | 215 | −0.6 | 3 |
| | 4 | 98 | rem | | | | | | | | | | 139 | 262 | −1.7 | 5 |
| | 5 | 80 | rem | 0.1 | | | | | | | | | 139 | 211 | −0.4 | 3 |
| | 6 | 80 | rem | | 0.1 | | | | | | | | 138 | 214 | −0.3 | 2 |
| | 7 | 80 | rem | | | 0.1 | | | | | | | 138 | 209 | −0.4 | 2 |
| | 8 | 80 | rem | | | | | | | 0.1 | | | 139 | 210 | −0.4 | 2 |
| | 9 | 80 | rem | | | | 0.1 | | 0.1 | | | | 139 | 210 | −0.3 | 1 |
| | 10 | 80 | rem | | | | | 0.1 | | | 0.1 | | 138 | 216 | −0.2 | 2 |
| Comp. | 1 | | rem | | | | | | | | | Pb37 | 183 | 183 | 3.7 | 0 |
| | 2 | 57 | rem | | | | | | | | | | 138 | 139 | 4.2 | 0 |
| | 3 | 100 | | | 0 | | | | | | | | 270 | 270 | −1.8 | 17 |

1. Composition of Flux A

| | |
|---|---|
| polymerized rosin | 30% |
| bisphenol A epoxy resin | 30% |
| phthalic anhydride | 20% |
| hydrogenated castor oil | 2% |
| triethanolamine HBr | 1% |
| phenylglycol | 17% |

2. Proportions in Solder Paste

| | |
|---|---|
| Solder alloy powder | 90.5 mass % |
| Flux | 9.5 mass % |

3. Test Method (1) Melting Point

The melting point of the solder powder was measured using a differential scanning calorimeter. Measurement was carried out with a rate of temperature increase of 5° C. per minute and a sample weight of approximately 0.080 g. The solidus temperature and liquidus temperature were determined from the resulting chart.

(2) Volumetric Expansion at the Time of Melting of the Solder

The volumetric expansion at the time of melting of the solder was calculated using the following formula based on the volume of each solder alloy at its liquidus temperature and the volume at its solidus temperature:

[(volume at liquidus temperature)−(volume at solidus temperature)]/(volume at solidus temperature)×100

The volume at the liquidus temperature was measured using the direct reading method with a specific gravity bottle. A stick-shaped piece of solder which had been weighed was Here, the volume at room temperature=weight of solder charged into specific gravity bottle/specific gravity of solder (3) Self-Alignment Properties Solder paste was applied to the lands of a printed circuit board, and 0603-size (0.6×0.3 mm) ceramic chip capacitors were mounted on the coated portions at an angle of 30° from the proper mounting positions. There is a return (self-alignment recovery) of at least 90-97% on average after soldering in a reflow furnace. In our experiment, it was observed whether the slope between lands was at most 3° from the proper mounting position. Twenty specimens of each solder paste were tested, and the number of specimens for which the slope was not at most 3° (number of NG) was used to evaluate self-alignment properties.

4. Test Results

In Table 1, for Examples 1-10 which are solder alloy compositions according to the present invention, the volumetric expansion at the time of melting of the solder alloy was at most 0.5% (0.5% to −1.7%), and the expansion was extremely small or else there was contraction. In contrast, for the eutectic solder of Comparative Example 1 or the 57Bi—Sn solder alloy composition of Comparative Example 2, the volumetric expansion at the time of melting of the solder alloy was a markedly higher value of 3.7 and 4.2. The volumetric expansion at the time of melting of the alloy composition of Comparative Example 3 which was 100% Bi was the lowest value of −1.8%, but the self-alignment properties were markedly decreased compared to the examples.

Example B

In addition to the above-described flux A, fluxes B and C which used different types of curing agent were prepared. For comparison, flux D, which contained a cresol novolak epoxy resin and an amine curing agent, was prepared.

These fluxes were mixed with powder (average particle diameter of 25-35 μm) of solder alloys (a Bi—Sn binary alloy or Sn) to manufacture a solder paste. The results of an oozing test and a solder ball test for each solder paste and a test of leaching rate of the solder alloys which were used are shown in Table 2.

TABLE 2

|  | No. | Composition (wt %) | | Flux type | Melting temperature (° C.) | | Oozing test | Solder ball test | Leaching rate ($\mu ms^{-1}$) |
|---|---|---|---|---|---|---|---|---|---|
|  |  | Bi | Sn |  | solidus | liquidus |  |  |  |
| Examples | 1 | 70 | rem | A | 139 | 180 | ○ | 2 | 0.32 |
|  | 2 | 80 | rem | B | 139 | 210 | ○ | 2 | 0.27 |
|  | 3 | 85 | rem | C | 139 | 215 | ○ | 2 | 0.21 |
|  | 4 | 98 | rem | A | 139 | 262 | ○ | 2 | 0.09 |
| Comparative Examples | 1 | 80 | rem | D | 139 | 210 | X | 4 | 0.27 |
|  | 2 | 100 | rem | D | 270 | 270 | ○ | 4 | 0.02 |
|  | 3 | 57 | rem | A | 138 | 139 | X | 2 | 0.43 |
|  | 4 | 57 | rem | D | 138 | 139 | ○ | 4 | 0.43 |
|  | 5 | rem | 100 | D | 231 | 231 | X | 4 | 1.88 |

1. Flux Composition (Mass Percent)

Flux B (Example of the Present Invention)

| polymerized rosin | 36% |
| bisphenol A epoxy resin | 30% |
| adipic acid | 15% |
| hydrogenated castor oil | 2% |
| triethanolamine HBr | 1% |
| phenylglycol | 16% |

Flux C (Example of the Present Invention)

| polymerized rosin | 30% |
| bisphenol A epoxy resin | 30% |
| phthalic anhydride | 15% |
| adipic acid | 5% |
| hydrogenated castor oil | 2% |
| triethanolamine HBr | 1% |
| phenylglycol | 17% |

Flux D (Comparative Example)

| polymerized rosin | 30% |
| cresol novolak epoxy resin | 30% |
| triethanolamine | 18% |
| dicyandiamide | 2% |
| hydrogenated castor oil | 2% |
| triethanolamine HBr | 1% |
| phenylglycol | 17% |

2. Proportions in Solder Paste (Same as for Example A)

| Solder alloy powder | 90.5 mass % |
| Flux | 9.5 mass % |

3. Test Method (1) Outflow of Solder (Oozing)

A solder paste was applied to portions to be soldered of a printed circuit board, and 0603-size ceramic chip capacitors were mounted on the portions to be soldered. The printed circuit board on which the capacitors were mounted was sealed with an epoxy resin, and after being left in an environment at 85° C. and 85% relative humidity, it was heated under reflow conditions with a peak temperature of 260° C., and the rate of defects in which solder flowed out was evaluated. After soldering, the ceramic chip capacitors were peeled off the printed circuit board, and it was observed whether there was oozing or seeping on the front or rear surface of the capacitor. Those specimens for which there was no oozing were evaluated as ○, and those for which oozing occurred were evaluated as X. 300 capacitors were tested for each solder paste.

(2) Solder Balls

In accordance with Appendix 11 of JIS Z 3284, solder paste was printed on an aluminum substrate using a special mask, and a specimen prepared by sitting for 30 minutes was contacted with the surface of a solder bath containing molten solder, the specimen was removed 5 seconds after the solder paste melted, and after the solder solidified, the state of occurrence of solder balls was observed. The solder bath was set to a temperature 50° C. above the liquidus temperature of the alloy being tested. The solder balls were categorized based on Table 1 in Appendix 11 of JIS Z 3284.

(3) Leaching Rate of Cu

A solder alloy to be tested was placed into a solder tank and melted by heating to 400° C. Copper wire with a wire diameter of 1000 μm was immersed for 10 seconds in this molten solder. The speed of leaching (μm per second) was found from the wire diameter of the copper wires after immersion using the following formula. 6 wire specimens were tested for each solder alloy.

Rate of leaching=(1000−measured wire diameter)/²⁄₁₀

4. Test Results

As can be seen from Table 2, in Examples 1-4 using a flux containing a bisphenol A epoxy resin and a carboxylic acid curing agent, there was no oozing of solder and there were few solder balls. In contrast, in Comparative Examples 1, 2, 4, and 5 using a flux containing a dicyandiamide as a curing agent, there were many solder balls. In Comparative Example 3 in which the flux was the same as in the examples but the Bi content of the solder alloy was small, the amount of solder balls was small, but oozing of the solder occurred, and the speed of Cu melting corrosion by the solder alloy was large.

Electronic parts manufactured by initial soldering using a solder paste according to the present invention did not have oozing of molten solder from the initially soldered portion at the time of second soldering in step soldering, and the amount of formation of solder balls was small. There was no occurrence of short circuits between electronic parts. In addition, it was found from the results of the self-alignment test that a solder paste according to the present invention does not cause positional deviations, and soldering can be performed in a prescribed portion to be soldered, so its reliability is excellent.

INDUSTRIAL APPLICABILITY

A solder paste according to the present invention is not limited to use in step soldering, and depending upon the liquidus temperature of the solder alloy, it can be used in all types of soldering. In particular, it is suitable for use in applications for which high-temperature solders have conventionally been used. For example, it can be used for soldering of portions which reach a high temperature due to heat generated during use of electronic equipment. In addition, the number of times soldering is performed in step soldering is not limited to two, and it may be performed three or more times. In this case, a solder paste according to the present invention is preferably used for soldering other than the last time.

The invention claimed is:

1. A solder paste comprising a solder alloy powder and a flux, the solder alloy comprising 70-98 mass % of Bi and a remainder of Sn and having volumetric expansion of at most 0.5% at the time of melting, the flux containing a bisphenol A epoxy resin and a curing agent selected from a dicarboxylic acid and a carboxylic anhydride.

2. A solder paste as claimed in claim 1 wherein the solder alloy consists of 70-98 mass % of Bi and 2-30 mass % of Sn.

3. A solder paste as claimed in claim 1 wherein the solder alloy further comprises at least one substance selected from Ag, Cu, Sb, In, Zn, Ni, Cr, Fe, Mo, P, Ge, and Ga in a total amount of at most 0.5 mass %.

4. A solder paste as claimed in claim 1 wherein the solder alloy consists of 70-98 mass % of Si, at least one substance selected from Ag, Cu, Sb, In, Zn, Ni, Cr, Fe, Mo, P, Ge, and Ga in a total amount of at most 0.5 mass %, and a remainder of Sn.

5. A solder paste as claimed in claim 1 wherein the flux further contains a rosinous resin, a thixotropic agent, and an activator.

6. A solder paste as claimed in claim 1 wherein a volume ratio of the solder alloy powder to the flux is in the range of 1:1 to 1:1.5.

7. A soldering method comprising soldering using a solder paste as claimed in claim 1, the method including curing the epoxy resin of the solder paste during soldering by a reaction with a curing agent and forming a soldered portion covered by a thermally set bisphenol A epoxy resin.

8. A step soldering method comprising initial soldering comprising forming a soldered part using a solder paste as claimed in claim 1 and second soldering comprising soldering the soldered part formed by the initial soldering to another object.

9. A step soldering method as claimed in claim 8 wherein the second soldering is carried out with a lead-free solder having Sn as a main component.

10. An electronic part having a soldered portion which is formed by soldering using a solder paste as claimed in claim 1 and which is covered with a thermally set bisphenol A epoxy resin.

11. An electronic part comprising an electronic element bonded to a substrate by a soldered joint covered with a material primarily comprising a thermally set bisphenol A epoxy resin, the soldered joint being formed from a solder alloy having volumetric expansion at the time of melting of the solder alloy of at most 0.5%.

* * * * *